United States Patent
Pogrebinsky et al.

(10) Patent No.: US 7,738,565 B1
(45) Date of Patent: Jun. 15, 2010

(54) PEAK DETECTOR

(75) Inventors: Victor Pogrebinsky, San Jose, CA (US); Vladimir Pogrebinsky, Campbell, CA (US)

(73) Assignee: Magnetic Recording Solutions, Inc., Santa Clara, CA (US)

( * ) Notice: Subject to any disclaimer, the term of this patent is extended or adjusted under 35 U.S.C. 154(b) by 1003 days.

(21) Appl. No.: 11/433,175

(22) Filed: May 11, 2006

Related U.S. Application Data

(60) Provisional application No. 60/788,511, filed on Mar. 30, 2006.

(51) Int. Cl.
H04B 14/04 (2006.01)

(52) U.S. Cl. .................. 375/242; 375/342; 375/345; 375/268; 375/269; 375/283; 341/132; 341/123; 341/156; 341/164; 327/58; 327/59; 327/93; 327/100; 327/61

(58) Field of Classification Search .......... 327/59, 327/93, 100, 161, 58, 61, 79, 84, 85; 375/345, 375/342, 320, 330–332, 268, 269, 283, 226–228; 341/132, 123, 156, 164

See application file for complete search history.

(56) References Cited

U.S. PATENT DOCUMENTS

| | | | | |
|---|---|---|---|---|
| 3,826,988 A | * | 7/1974 | Wise et al. ............... | 327/9 |
| 3,968,487 A | * | 7/1976 | Herring et al. ............ | 341/141 |
| 4,311,960 A | * | 1/1982 | Barr ......................... | 324/103 P |
| 4,943,974 A | * | 7/1990 | Motamedi .................. | 375/149 |
| 5,448,202 A | * | 9/1995 | Owen ........................ | 329/323 |
| 5,559,460 A | * | 9/1996 | Cunningham .............. | 327/179 |
| 5,594,384 A | | 1/1997 | Carroll et al. .............. | 324/369 |
| 5,982,215 A | * | 11/1999 | Kaji ......................... | 327/307 |
| 6,125,154 A | * | 9/2000 | Sutardja .................... | 375/345 |
| 6,188,250 B1 | | 2/2001 | Voorman et al. ........... | 327/58 |
| 6,191,621 B1 | | 2/2001 | Ota ........................... | 327/58 |

\* cited by examiner

*Primary Examiner*—David C Payne
*Assistant Examiner*—Rahel Guarino
(74) *Attorney, Agent, or Firm*—Silicon Valley Patent Group LLP

(57) ABSTRACT

A peak detector provides repeatable and accurate measurements of the signal amplitude for variable frequencies of input signals. The peak detector includes a pulse edge generator circuit that generates a pulse edge signal in response to the signal peaks of an input signal and a sampler circuit that is triggered to sample the input signal by the pulse edge signal. The pulse edge generator circuit compares the input signal with a delayed version of the input signal to produce a differential signal and generates the pulse edge signal using the differential signal. An analog or digital sampler is triggered by the pulsed edge signal to measure the information, e.g., peak value, of the input signal. One or more delay circuits may be used to align the edges of the pulsed edge signal with the peaks of the input signal.

20 Claims, 4 Drawing Sheets

PEAK DETECTOR

CROSS-REFERENCE TO RELATED APPLICATIONS

This application claims the benefit of U.S. Provisional Application No. 60/788,511, filed Mar. 30, 2006, entitled "Peak Detector".

FIELD OF THE INVENTION

The present invention is related to a method and apparatus for detecting and measuring peaks in a signal.

BACKGROUND

Peak detectors are used to detect the peak amplitude of a signal, such as an analog electronic signal. Examples of peak detector units are described in U.S. Pat. No. 6,188,250; U.S. Pat. No. 6,191,621; and U.S. Pat. No. 5,594,384, which are incorporated herein by reference. The main shortcomings of known peak detectors are caused by factors such as capacitor leakage, voltage drop in rectifying diodes, and slow amplifier feedback. An improved peak detector is desirable.

SUMMARY

In accordance with an embodiment of the present invention, a peak detector includes a pulse edge generator circuit that generates a pulse edge signal in response to the signal peaks of an input signal and a sampler circuit that is triggered to sample the input signal by the pulse edge signal. The pulse edge generator circuit compares the input signal with a delayed version of the input signal to produce a differential signal and generates the pulse edge signal using the differential signal. An analog or digital sampler is triggered by the pulsed edge signal to measure the information, e.g., peak value, of the input signal. One or more delay circuits may be used to align the edges of the pulsed edge signal with the peaks of the input signal. In one embodiment, the peak detector is capable of providing repeatable and accurate measurements of the signal amplitude for variable frequencies of input signals.

DETAILED DESCRIPTION

Figure 1:
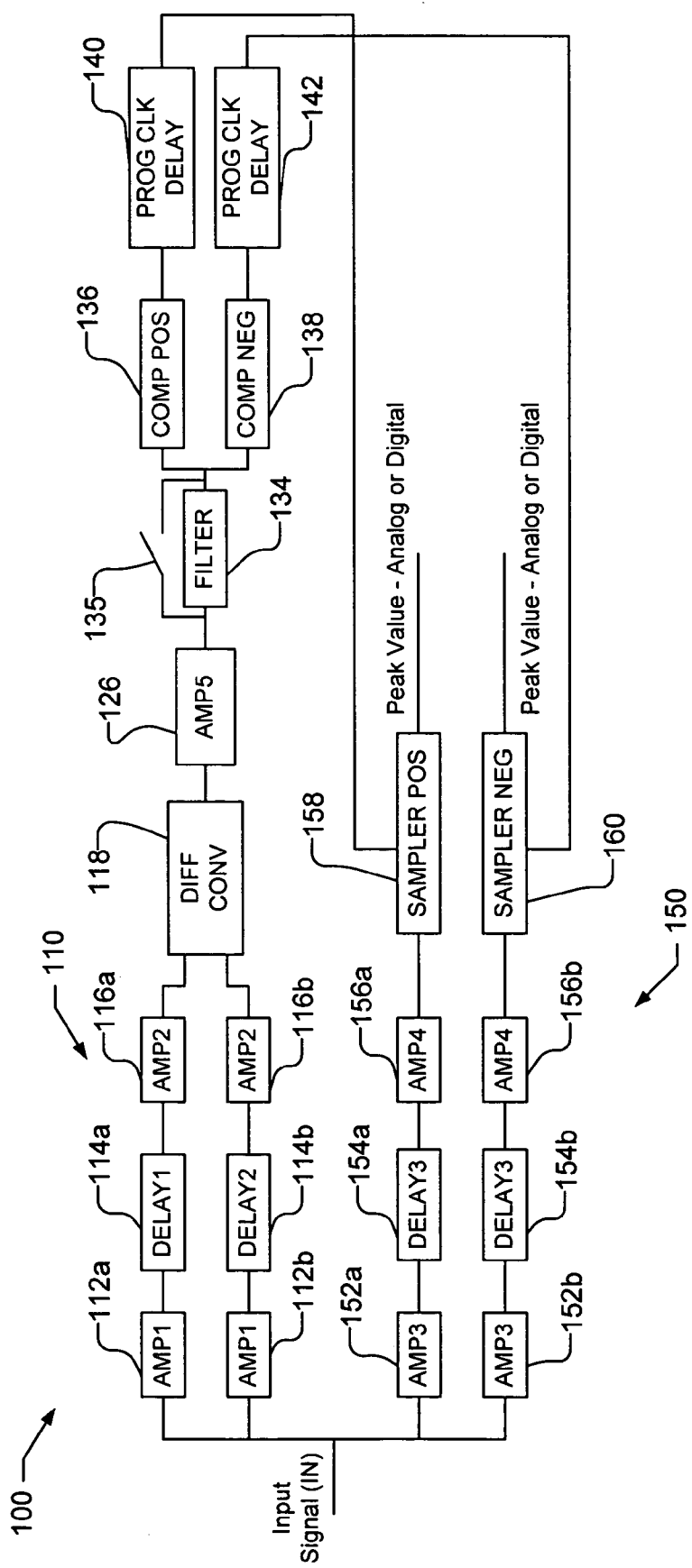
FIG. 1 illustrates an embodiment of a peak detector.

FIG. 1 illustrates an embodiment of a peak detector 100, which is capable of peak detection of up to, e.g., Gigahertz range, of a periodic or non-periodic input signal. The peak detector 100 includes two channels, a peak detection circuit 110, in which the peak of an incoming signal IN is detected and a pulse edge signal is produced in response, and a sampler circuit 150, in which information regarding the amplitude of the signal peak is captured from the input signal based on the pulse edge signal.

The peak detection circuit 110 shown in FIG. 1 generates pulse edges on the positive and negative signal peaks. As illustrated in FIG. 1, the input signal IN is applied to two symmetrical amplifiers (AMP1) 112a and 112b with equal gain and propagation delay. The outputs signals of the amplifiers 112a and 112b are received by two analog delay circuits (DELAY1) 114a and DELAY2 114b, respectively. Both the analog delay circuits 114a and 114b have constant but unequal delays and equal gains. Thus, one of the analog delay circuits, e.g., circuit 114b, will have a slightly longer delay than the other analog delay circuit. In one embodiment, one of the analog delay circuits, e.g., circuit 114b, may have a variable delay, but with the same gain as the other analog delay circuit. The outputs signals of the analog delay circuits 114a and 114b, which are equal in amplitude but slightly different in phase, are impedance matched to another pair of symmetrical amplifiers AMP2 116a and 116b, respectively, which have equal gain and propagation delay.

The output signals from amplifiers 116a and 116b are received by a differential converter (DIFF CONV) 118. The differential converter 118 produces a differential output signal that is proportional to the phase difference of the signals at its input terminals, i.e., the output signals from amplifiers 116a and 116b.

Figure 2A:
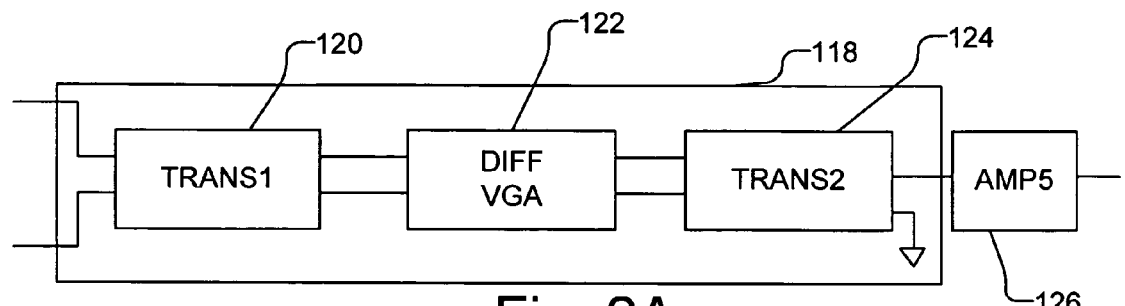
FIGS. 2A, 2B, 2C illustrate an implementations of the differential converter illustrated in FIG. 1.
Figure 2B:
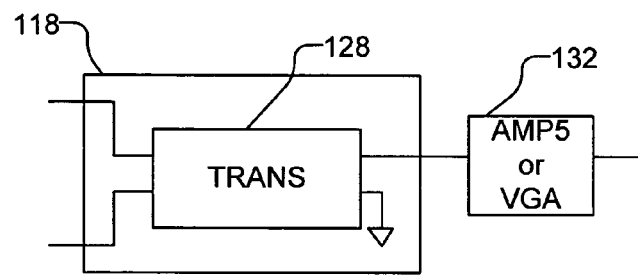
Figure 2C:
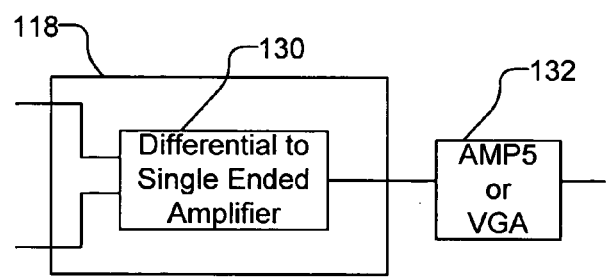

FIGS. 2A, 2B, and 2C illustrate possible circuit implementations of the differential converter 118 shown in FIG. 1. As shown in FIG. 2A, the differential converter 118 may include a first transformer (TRANS1) 120 followed by a differential variable gain amplifier (DIFF VGA) 122 and a second transformer (TRANS2) 124. The differential converter 118 illustrated in FIG. 2A is followed by a fixed gain amplifier (AMP5) 126. Alternatively, as respectively illustrated in FIGS. 2B and 2C, the differential converter 118 may be a transformer (TRANS) 128 or a differential to single ended amplifier 130, followed by an amplifier 132, which may be a fixed gain amplifier (AMP5) or variable gain amplifier (VGA). The differential converter 118 illustrated in FIG. 2A is followed by a fixed gain amplifier, not a variable gain amplifier, as the differential converter 118 includes a DIFF VGA 122.

Figure 3:
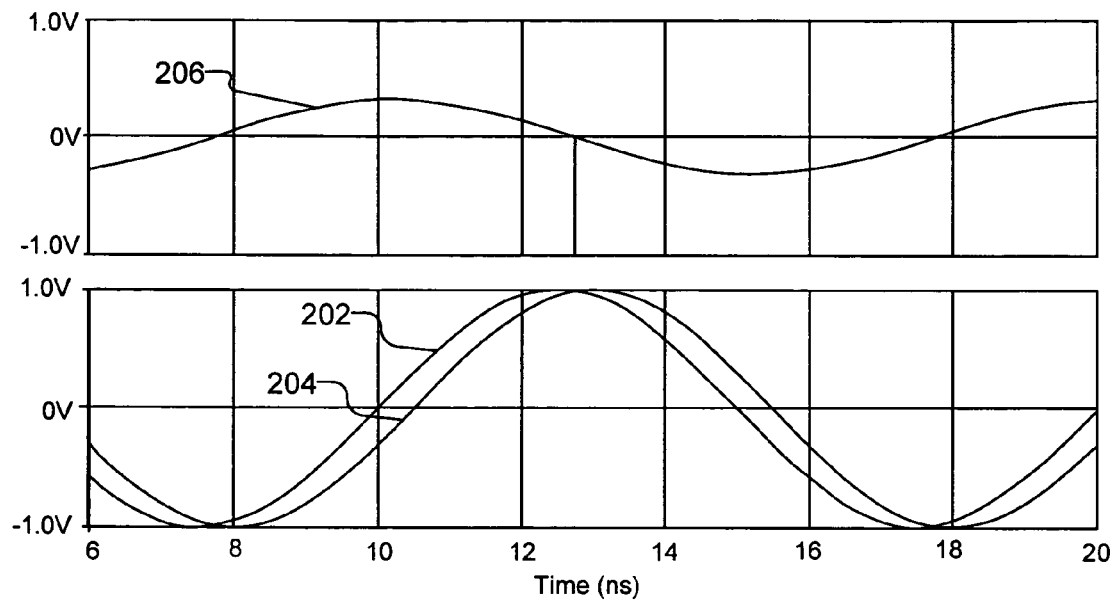
FIGS. 3 and 4 illustrate the input signals to the differential converter (bottom graphs) and the resulting output signal from the differential converter (top graphs), where the input signals in FIG. 4 have twice the signal frequency.
Figure 4:
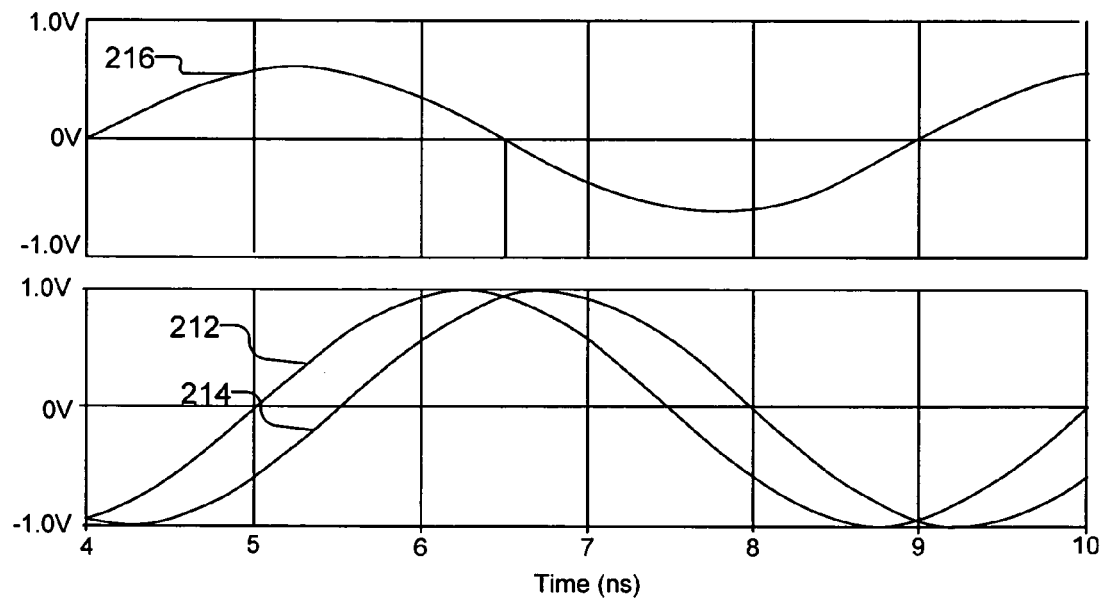

FIG. 3 illustrates the input signals 202 and 204 to the differential converter 118 in the bottom graph and the resulting differential converter output signal 206, which is the difference in amplitude of the input signals, in the top graph. FIG. 4 similarly illustrates input signals 212 and 214 to the differential converter 118 in the bottom graph and the resulting differential output signal 216 from the differential converter 118 in the top graph. By way of example, the input signals 202 and 212 are the output signals from amplifier 116a and the delayed input signals 204 and 214 are the output signals from amplifier 116b.

As illustrated in FIGS. 3 and 4, the input signals 202, 204 and 212, 214 to the differential converter 118 have the same amplitudes, but the input signals 212, 214 in FIG. 4 have twice the signal frequency as the input signals 202, 204 in FIG. 3. Examining the differential output signals 206 and 216 of the differential converter 118 in FIGS. 3 and 4, it can be seen that the higher amplitude is found in the differential output signal 216, which corresponds to the higher frequency input signals 212, 214. Additionally, it can be seen that relative to differential output signal 206, the slope of the differential output signal 216 is steeper at the zero crossing and, thus, differential output signal 206 provides a faster rise in amplitude. To maintain the same signal amplitude in the differential output signal, the delay of the input signals to the differential converter 118, e.g., caused by delay circuit 114b, can be made shorter for the higher frequencies and narrow frequency ranges.

Figure 5:
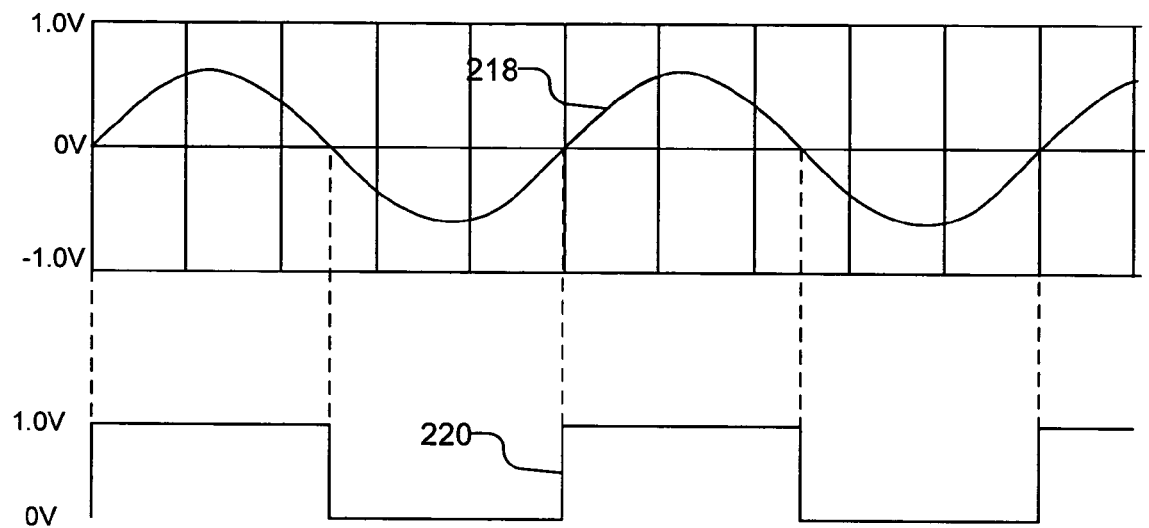
FIG. 5 illustrates an example of a pulsed edge signal with edges that coincide with the zero crossing of the differential signal from the differential converter.

Referring back to FIG. 1, one or more comparators generate signal edges by changing states at the zero crossing of the differential output signal from the differential converter 118. As illustrated in FIG. 1, a comparator circuit (COMP POS) 136 is used to generate an edge for the positive peaks and another comparator circuit (COMP NEG) 138 is used to generate an edge for the negative peaks. FIG. 5 illustrates an example of a pulsed edge signal 220 with edges that coincide with the zero crossing of the differential output signal 218 from the differential converter 118.

When the delay at the delay circuit 114b is reduced the peaks of two input signal waveforms to the differential converter 118 are pulled closer together, resulting in the zero crossing of the differential output signal being closer to the signal peak and, thus, the comparator circuit 136 switching closer to the signal peak. Thus, with a small delay at the delay circuit 114b, the accuracy of the peak detection is increased. However, for wide frequency ranges, setting the delay at delay circuit 114b too small may cause degradation of signal-to-noise ratio (SNR) due to the differential converter 118 producing a differential output signal with a low amplitude and flatter slope at the low end of the frequency range. This problem can be dealt with using a variable delay circuit 114b and (or) using a variable gain amplifier (VGA) 132 at the output terminal of the differential converter 118, as illustrated in FIGS. 2B and 2C, or within the differential converter 118, as illustrated in FIG. 2A. Moreover, a filter 134 following the amplifier 126 (or variable gain amplifier 132) may be used to also improve the signal to noise ratio. The filter 134 may be removed from the circuit with switch 135 if desired, as illustrated in FIG. 1.

Figure 6:
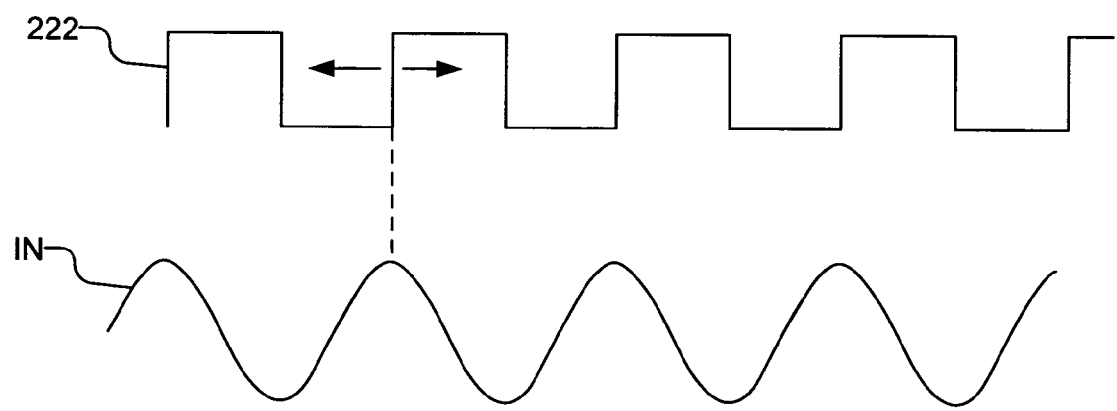
FIG. 6 illustrates aligning the pulsed edge signal from the comparator circuit with the peaks of the input signal.

The edges in the pulsed edge signals produced by the positive and negative comparator circuits 136 and 138 are aligned with the positive and negative peaks of the input signal IN to the sampler circuit 150 by means of respective programmable clock delay circuits (PROG CLK DELAY) 140 and 142. FIG. 6 illustrates aligning a pulsed edge signal 222, e.g., from positive comparator circuit 136, with the input signal IN. As illustrated by the arrows in FIG. 6, the delay in the programmable clock delay circuit 140 is adjusted to alter the phase of the pulsed edge signal 222 until an edge of the pulsed edge signal 222 is aligned with a peak of the input signal IN. The peak to which the edge of the pulsed edge signal 222 is aligned is the same peak that was used to form the edge. FIG. 6 illustrates aligning an increasing edge of the pulsed edge signal 222 with a positive peak of the input signal IN, but if desired, the decreasing edge may be used. The pulsed edge signal from the negative comparator circuit 138 is similarly aligned with a negative peak of the input signal IN. It should be understood that the programmable clock delay circuits 140 and 142 may be considered part of the peak detection circuit 110 or the sampler circuit 150.

After aligning the edges of the pulsed edge signal from comparator circuits 136 and 138 with the positive and negative signal peaks in the input signal IN, the sampler circuit 150 is triggered using the pulsed edge signal to capture information about the values of the peaks of the input signal IN.

As illustrated in FIG. 1, the input signal IN is routed to the sampler circuit 150 through two amplifiers (AMP3) 152a and 152b with equal gain and propagation delay followed by two analog delay circuits (DELAY3) 154a and 154b with equal delay and gain and two additional amplifiers (AMP4) 156a and 156b for impedance matching and amplitude adjustment.

As discussed above, the input signal IN has to be aligned with the edges of the pulsed edge signals from the peak detection circuit 110. A coarse signal alignment can be achieved using the delay circuits 154a and 154b. The fine edge alignment is accomplished by the programmable clock delay circuits 140 and 142 in the peak detection circuit 110.

Samplers (SAMPLER POS) 158 and (SAMPLER NEG) 160 receive the input signal IN from amplifiers 156a and 156b, respectively, and are triggered by the edges of the pulsed edge signals from the programmable clock delay circuits 140 and 142, respectively, to measure the information, e.g., peak value, of the signal peak of the input signal IN. The samplers 158 and 160 can be analog circuits, e.g., sample and hold, or an analog to digital converter.

In an embodiment in which only the positive peak or the negative peak is desired to be measured, only one sampler circuit and the preceding amplifier and delay circuits, are necessary in the sampler circuit 150. Additionally, only one comparator and programmable clock delay circuit is necessary in the peak detection circuit 110.

The peak detection circuit 100 provides repeatable and accurate measurements of the signal amplitude for variable frequencies assuming that selected components have constant propagation delay and gain for the selected frequency ranges. The SNR optimization accomplished by using a variable gain amplifier does not alter the position of the edges relative to the signal peaks and thus does not affect the measurement accuracy. For a wide frequency range, sub-ranges can be used with the different delay circuit 114b settings for each sub-range for optimal SNR. The edge position alignment will then be required only within each sub-range.

Table 1 provides exemplary components and their manufacturer for the peak detector 100 illustrated in FIGS. 1 and 2A.

TABLE 1

| | |
|---|---|
| AMP1, AMP2, AMP3 | DUAL OPERATIONAL AMPLIFIER THS3202, TEXAS INSTRUMENTS |
| DELAY3, DELAY4 | ANALOG DELAY LINE CDA5005, ELMEC TECHNOLOGIES |
| AMP4 | OPERATIONAL AMPLIFIER AD8009, ANALOG DEVICES |
| SAMPLER POS, SAMPLER NEG | A/D CONVERTER AD9480, ANALOG DEVICES |
| DELAY1 | ANALOG DELAY LINE CDA0405, ELMEC TECHNOLOGIES |
| DELAY2 | ANALOG DELAY LINE CDA0105, ELMEC TECHNOLOGIES |
| TRANS1 | ADT1-1WT, MINICIRCUITS |
| TRANS2 | ADT1-1, MINICIRCUITS |
| DIFF VGA | THS7530, TEXAS INSTRUMENTS |
| AMP5 | OPERATIONAL AMPLIFIER THS3201, TEXAS INSTRUMENTS |
| FILTER | SCLF-225, MINICIRCUITS |
| COMP POS, COMP NEG | DUAL COMPARATOR MAX-9601, MAXIM |
| PROG CLK DELAY | MC100EP195, ON SEMICONDUCTOR |

Is should be understood that the above components are provided for illustrative purposes and that other appropriate components may be if desired. Moreover, additional components or circuits may be used. For example, another transformer, similar to TRANS1 may be located after the amplifiers 156a and 156b in front of the A/D converters of the sampler circuits 158 and 160.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
receiving an input signal;
generating pulse edges based on the peaks of the input signal using a peak detection circuit, wherein generating pulse edges based on the peaks of the input signal comprises:
  splitting the input signal into a first input signal and a second input signal;
  delaying the second input signal with respect to the first input signal;
  comparing amplitudes of the first input signal and the delayed second input signal to produce an amplitude differential signal; and
  generating the pulse edges using the amplitude differential signal; and
measuring the values of the peaks of the input signal using the generated pulse edges using a sampler circuit, wherein measuring the values of the peaks of the input signal using the generated pulse edges comprises:
  aligning the pulse edges with the peaks of the input signal, wherein aligning the pulse edges with the peaks of the input signal comprises delaying the input signal; and
  triggering the sampling of the input signal by the pulse edges.

2. The method of claim 1, wherein generating the pulse edges using the amplitude differential signal comprises generating pulse edges at the zero crossing of the amplitude differential signal.

3. The method of claim 1, further comprising adjusting the delay of the second input signal to improve signal to noise ratio.

4. The method of claim 1, further comprising amplifying the
amplitude differential signal prior to generating the pulse edges.

5. The method of claim 4, further comprising controlling the gain in the amplification of the amplitude differential signal to improve signal to noise ratio.

6. The method of claim 1, wherein pulse edges are generated on at least one of the positive peaks and the negative peaks and at least one of the positive peaks and the negative peaks are sampled using the generated pulse edges.

7. The method of claim 1, wherein aligning the pulse edges with the peaks of the input signal further comprises delaying the pulse edges.

8. An apparatus for detecting the value of signal peaks of an input signal, the apparatus comprising:
a pulse edge generator circuit that receives the input signal and generates a pulsed edge signal in response to at least one of positive signal peaks and negative signal peaks, wherein the pulse edge generator circuit divides the input signal into a first input signal and a second input signal, the pulse edge generator circuit comprising:
  a delay circuit that delays the second input signal with respect to the first input signal;
  a differential converter circuit that receives the first input signal and the delayed second input signal, the differential converter compares amplitudes of the first input signal and the delayed second input signal to produce an amplitude differential signal; and
  a comparator circuit that receives the amplitude differential signal, the comparator circuit producing the pulsed edge signal; and
a sampler circuit that receives the input signal and the pulsed edge signal, the sampler circuit is triggered to sample the input signal by the pulsed edge signal to produce the value of a signal peak of the input signal;
wherein the pulse edge generator generates a pulsed edge signal in response to both the positive signal peaks and the negative signal peaks;
wherein the sampler circuit comprises a first sampler that receives the input signal and the pulsed edge signal that is in response to the positive signal peak and a second sampler that receives the input signal and the pulsed edge signal that is in response to the negative signal peak.

9. The apparatus of claim 8, further comprising a delay circuit that receives the pulsed edge signal and delays the pulsed edge signal, wherein the sampler circuit receives the pulsed edge signal after the delay circuit delays the pulsed edge signal.

10. The apparatus of claim 9, wherein the delay circuit is controllable to produce a delay in the pulsed edge signal that aligns a pulsed edge in the pulsed edge signal with a signal peak of the input signal in the sampler circuit.

11. The apparatus of claim 8, wherein the delay circuit is adjustable to change the amount of delay in the second input signal with respect to the first input signal.

12. The apparatus of claim 8, wherein pulsed edge generator circuit further comprises a variable gain amplifier to adjust the gain of the amplitude differential signal.

13. The apparatus of claim 12, wherein the variable gain amplifier is disposed between the differential converter circuit and the comparator circuit or within the differential converter circuit.

14. The apparatus of claim 8, further comprising a filter disposed between the differential converter circuit and the comparator circuit.

15. The apparatus of claim 8, wherein the differential converter circuit comprises at least one of a transformer and a differential to single ended amplifier.

16. The apparatus of claim 8, wherein the comparator circuit is a positive comparator circuit that receives the amplitude differential signal and produces a pulsed edge signal in response to the positive signal peaks, the apparatus further comprising a negative comparator circuit that receives the amplitude differential signal and produces a pulsed edge signal in response to the negative signal peaks.

17. The apparatus of claim 8, wherein the sampler circuit comprises an analog sampler that is triggered by the pulsed edge signal.

18. The apparatus of claim 8, wherein the sampler circuit comprises an analog to digital converter that is triggered by the pulsed edge signal.

19. A method comprising:
receiving an input signal;
generating pulse edges based on the peaks of the input signal using a peak detection circuit, wherein generating pulse edges based on the peaks of the input signal comprises:
  splitting the input signal into a first input signal and a second input signal;
  delaying the second input signal with respect to the first input signal;
  comparing amplitudes of the first input signal and the delayed second input signal to produce an amplitude differential signal; and generating the pulse edges using the amplitude differential signal; and measuring the values of the peaks of the input signal using the generated pulse edges, wherein pulse edges are generated on both the positive peaks and the negative peaks of the input signal and the values of the positive peaks of the input signal are measured using a generated pulse edge using a first sampler circuit and the values of the negative peaks of the input signal are measured a generated pulse edge using a second sampler circuit.

20. The method of claim 19, wherein measuring the values of the peaks of the input signal using the generated pulse edges comprises:

aligning the pulse edges with the peaks of the input signal, wherein aligning the pulse edges with the peaks of the input signal comprises delaying the input signal; and triggering the sampling of the input signal by the pulse edges.

\* \* \* \* \*